(12) United States Patent
Ma et al.

(10) Patent No.: US 6,451,634 B2
(45) Date of Patent: Sep. 17, 2002

(54) METHOD OF FABRICATING A MULTISTACK 3-DIMENSIONAL HIGH DENSITY SEMICONDUCTOR DEVICE

(75) Inventors: William Hsioh-Lien Ma, Fishkill, NY (US); Dominic Joseph Schepis, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/925,525

(22) Filed: Aug. 10, 2001

Related U.S. Application Data

(62) Division of application No. 09/477,249, filed on Jan. 3, 2000, now Pat. No. 6,291,858.

(51) Int. Cl.$^7$ ............................................ H01L 21/84
(52) U.S. Cl. ...................... 438/155; 438/210; 438/311; 438/329; 438/382; 438/406; 438/517
(58) Field of Search ................................ 257/347, 382, 257/774, 777, 350, 379, 516, 532, 536; 438/406, 459, 149, 479, 517, 152, 155, 309, 311, 210, 329, 382

(56) References Cited

U.S. PATENT DOCUMENTS

| | | | | |
|---|---|---|---|---|
| 5,374,564 A | * | 12/1994 | Bruel | 438/455 |
| 5,631,186 A | * | 5/1997 | Park et al. | 438/155 |
| 5,654,220 A | * | 8/1997 | Leedy | 438/25 |
| 5,656,548 A | * | 8/1997 | Zavracky et al. | 438/23 |
| 5,670,387 A | * | 9/1997 | Sun | 438/155 |
| 5,741,733 A | * | 4/1998 | Bertagonolli et al. | 438/152 |
| 5,767,001 A | * | 6/1998 | Bertagnolli et al. | 438/455 |
| 5,844,294 A | * | 12/1998 | Kikuchi et al. | 257/500 |
| 5,882,987 A | * | 3/1999 | Srikrishnan | 438/458 |
| 5,889,302 A | * | 3/1999 | Liu | 257/315 |
| 5,998,808 A | * | 12/1999 | Matsushita | 257/74 |
| 6,291,858 B1 | * | 9/2001 | Ma et al. | 257/350 |

\* cited by examiner

Primary Examiner—Kamand Cuneo
Assistant Examiner—Alonzo Chambliss
(74) Attorney, Agent, or Firm—Connolly Bove Lodge & Hutz, LLP; Daryl K. Neff

(57) ABSTRACT

A multistack 3-D semiconductor structure comprising a first level structure comprising a first semiconductor substrate and first active devices; and a second level structure comprising a SOI semiconductor structure bonded to the first level structure and further comprising second active devices; and wherein the first active devices are more heat tolerant than the second active devices is provided along with a method for its fabrication.

12 Claims, 2 Drawing Sheets

METHOD OF FABRICATING A MULTISTACK 3-DIMENSIONAL HIGH DENSITY SEMICONDUCTOR DEVICE

CROSS-REFERENCE TO RELATED APPLICATION

This application is a divisional of U.S. patent application Ser. No. 09/477,249, filed Jan. 3, 2000 now U.S. Pat. No. 6,291,858.

TECHNICAL FIELD

The present invention relates to multistack 3-dimensional semiconductor structures. In addition, the present invention relates to a method for fabricating the multistack 3-dimensional semiconductor structures. According to the present invention, active devices are formed on a semiconductor substrate followed by adhering a second semiconductor layer above the active devices and then building active devices on this additional semiconductor layer. The present invention makes it possible to obtain improvements in function, density and performance as compared to multistack devices previously suggested.

BACKGROUND OF INVENTION

Planar technology is principally used currently for fabricating semiconductor surfaces. The level of integration that can be achieved on a semiconductor chip is limited by the size of the chip and by the structural fineness that is obtainable. The performance of a system which is realized using planar technology and which comprises a plurality of chips connected to one another is restricted by the number of possible connections between individual chips via connection contacts, the signal transmission speed that can be achieved via such connections (the so-called frequency performance) and also by the power consumption.

In order to overcome these restrictions, three-dimensional circuit arrangements have been suggested. In such arrangement, a plurality of chip planes are arranged one above the other in the third-dimensional circuit arrangements. The necessary electrical connections between the chip planes are produced by making direct contact.

For example, it has been suggested for producing three-dimensional integrated circuits, to deposit a further semiconductor layer on a substrate in which a plane of components has been produced. The semiconductor layer is recrystallized for instance by laser annealing. A further component plane is then realized in the recrystallized layer. The components produced in the substrate prior to the deposition of the further semiconductor are exposed during the recrystallization step to the thermal loading associated with the laser annealing, which leads to a very limited yield for the chips due to large numbers of defects which typically occur.

It has also been suggested to produce a three-dimensional integrated circuit by first producing the individual component planes separately from one another in different substrates. The substrates are then thinned to a few microns in thickness and are connected to one another with the aid of the wafer bonding method. For the electrical connection of the various component planes, the thin substrates are provided on their front and rear sides with contacts for subsequent interchip connections. This has the disadvantage that the thinned wafers have to be processed on both the front and rear sides. However, rear side processes are not provided in the standard planar technology. A number of handling problems remain unsolved in connection with this method. A further disadvantage of this particular method is that the functionality of the individual component planes cannot easily be tested before they are joined together, since individual components, but not completed circuits, are produced in each individual plane.

In addition, there have been suggestions for fabricating three-dimensional devices by creating the desired devices on individual semiconductor wafers prior to bonding them together to form the multilevel device. However, a major problem associated with this approach is that very precise alignment is required between the chips since the chips have already been built and are complete prior to the bonding. It is not entirely apparent how this precision alignment can be achieved on a practical basis. Furthermore, these processes require substantial thinning of one of the wafers by grinding or etching on the back side such as from a thickness of about 10–20 mils down to about 5 microns. This is an extremely different procedure to carry out. Moreover, great difficulties exist in controlling the thickness uniformity.

Accordingly, it would be desirable to provide three-dimensional multilayer devices that did not require the precise alignment as mentioned above.

SUMMARY OF INVENTION

The present invention provides for a multistack three-dimensional semiconductor structure that does not require the precision alignment of prior art devices. Moreover, the multistack three-dimensional semiconductor structures of the present invention make possible improvements in function, density and performance of the devices.

More particularly, the present invention relates to a multistack three-dimensional semiconductor structure that comprises a first level structure comprising a semiconductor substrate and first active devices. A second level structure comprising a SOI semiconductor structure is bonded to the first level structure and further comprises second active devices. The first active devices according to the present invention are more heat tolerant in device design than the second active devices.

In addition, the present invention relates to a method for fabricating a multistack three-dimensional semiconductor structure. The method comprises providing a first level structure comprising a semiconductor substrate and first active devices. A layer of insulation is provided on the first level structure and electrical interconnections are provided to connect selected portions of the first level structure to subsequently to be provided second level structure.

A second semiconductor structure is bonded on top of the insulating layer. The thickness of the semiconductor structure is reduced followed by forming second active devices on the semiconductor structure. The first active devices are more heat tolerant in device design than the second active devices. Electrical connections are created between the first level structure and second active devices.

The present invention also relates to semiconductor devices obtained by the above-described process.

Still other objects and advantages of the present invention will become readily apparent by those skilled in the art from the following detailed description, wherein it is shown and described preferred embodiments of the invention, simply by way of illustration of the best mode contemplated of carrying out the invention. As will be realized the invention is capable of other and different embodiments, and its several details are capable of modifications in various obvious respects, without departing from the invention.

Accordingly, the description is to be regarded as illustrative in nature and not as restrictive.

BRIEF DESCRIPTION OF DRAWING

The foregoing and other objects, aspects and advantages of the present invention will be better understood from the following detailed description of the present invention with reference to the drawings in which.

BEST AND VARIOUS MODES FOR CARRYING OUT INVENTION

In order to facilitate an understanding of the present invention, reference may be made to the figures which illustrate a diagrammatic representation of the steps of an embodiment according to the present invention.

Figure 1:
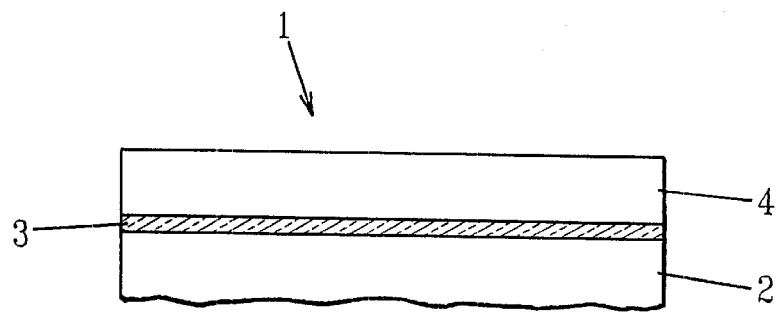
FIGS. 1–6 are schematic diagrams of a structure in accordance with the present invention in various stages of the process according to an embodiment of the present invention.

According to the present invention, a first semiconductor substrate 1 is provided. The semiconductor substrate is typically monocrystalline silicon or a SOI substrate (silicon on insulator substrate) as illustrated in FIG. 1. The SOI substrate comprises a silicon wafer 2 and an insulating layer 3 provided thereon. The insulating layer 3 can be grown on the substrate 2 or can be provided by deposition techniques such as chemical vapor deposition (CVD) or physical vapor deposition (PVD). Also, the insulating layer 3 can be provided by thermal oxidation of the substrate 2 to provide a silicon dioxide or insulating layer 3 can be provided by SIMOX or other well known methods of making SOI. Typically, this layer 3 is about 1000 to about 5000 Å thick and preferably about 1500 Å to about 2500 Å thick. A thin silicon layer 4 is provided on the insulating layer 3. This layer 4 is typically about 500 Å to about 4000 Å thick and preferably about 1000 Å to about 2000 Å thick. Active devices are created on the silicon substrate 4 by well known techniques. These active devices provided must have high thermal tolerance since they will be subjected to subsequent thermal cycling during the remaining fabrication of the device and as such are less sensitive to thermal processing as compared to the devices that are to be created in the second subsequent level such as having dopant profiles which are not as shallow as those in devices in the second level. Such devices can include resistors, capacitors, diodes and transistors, and other devices with relatively large thermal budgets.

Figure 2:
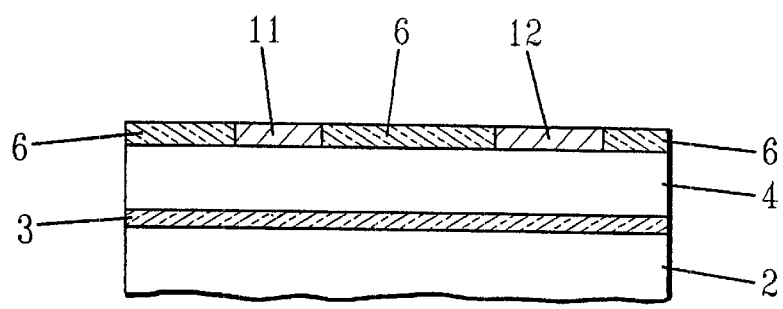

As illustrated in FIG. 2, an insulating layer 6 is provided on the device substrate 4. Typically, this layer is about 1000 Å to about 20,000 Å thick and preferably is about 1000 to about 10,000 Å thick, and is generally an oxide which can be formed for instance by thermal oxidation of the underlying silicon substrate or by known deposition techniques such as chemical vapor deposition or physical vapor deposition.

Selected portions of the insulating layer 6 are removed by etching in a predetermined pattern such as using reactive ion etching for providing vias therein for subsequent interconnections. Next, a conductive material such as doped polycrystalline silicon is deposited followed by chemical mechanical polishing to remove the polycrystalline from the top of the insulating layer 6 and to leave polycrystalline silicon in the vias to provide for local interconnection 11 of the non-critical devices and to provide for subsequent electrical interconnection 12 to the upper level to be provided. Furthermore, if alignment marks are needed, such can be opened by conventional lithography and reactive ion etching.

Figure 3:
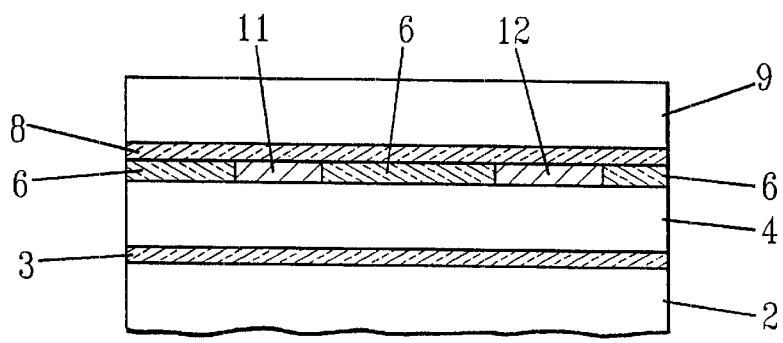

As illustrated in FIG. 3, a further insulating layer 8 is provided such as by chemical vapor deposition or physical vapor deposition. This insulating layer is typically about 50 Å to about 5000 Å thick and preferably about 100 Å to about 500 Å thick.

Next, a second semiconductor substrate 9 such as monocrystalline silicon is bonded to the insulating layer using Vander Walls force as described in U.S. Pat. No. 5,374,564. The second substrate is then thinned using binding or etching but preferably using a procedure referred to as "Smart Cut" or similar procedure such as SiGEN's PIII SOI process. A disclosure of Smart Cut processes can be found in Auberton-Herve, SOI: Materials to Systems, IDEM96-3210; U.S. Pat. Nos. 5,374,564 and 5,882,987, disclosures of which are incorporated herein by reference. Such process involves subjecting the silicon substrate 9 to ion implantation such as H+at a depth creating layer of gaseous microbubbles separated from a relatively thin upper region. In place of or in addition to hydrogen ions, rare gas ions can also be employed. After the silicon substrate is bonded to the oxide layer as discussed above, the substrate is subjected to thermal treatment at a temperature above that at which the ion bombardment took place and which thermal treatment creates a crystalline rearrangement in the wafer and pressure effect which causes separation between the thin film portion which is bonded to the insulating layer and the majority of the substrate. If desired, the device can be subjected to additional chemical mechanical polishing to planarize the second silicon layer 9. The thickness if typically about 500 Å to about 2500 Å.

Figure 4:
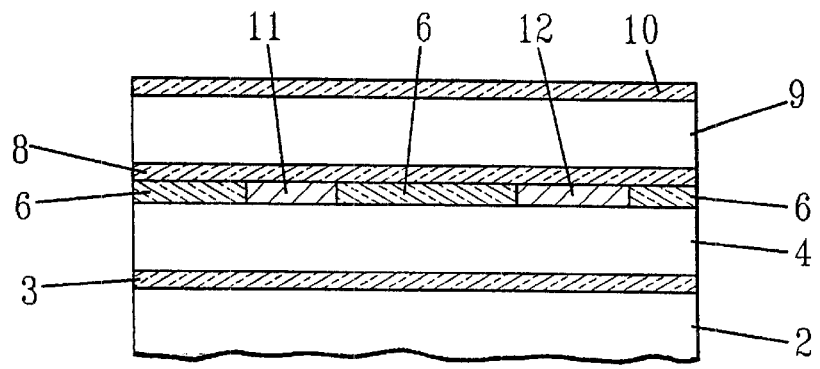

Next, as illustrated in FIG. 4, the high performance devices are created on the thin silicon layer 9 by well known techniques. Another insulating layer 10 such as silicon oxide and or silicon nitride is deposited such as by chemical vapor deposition. This layer is typically about 5000 Å to about 15,000 Å thick and preferably about 7000 to about 12,000 Å thick.

Figure 5:
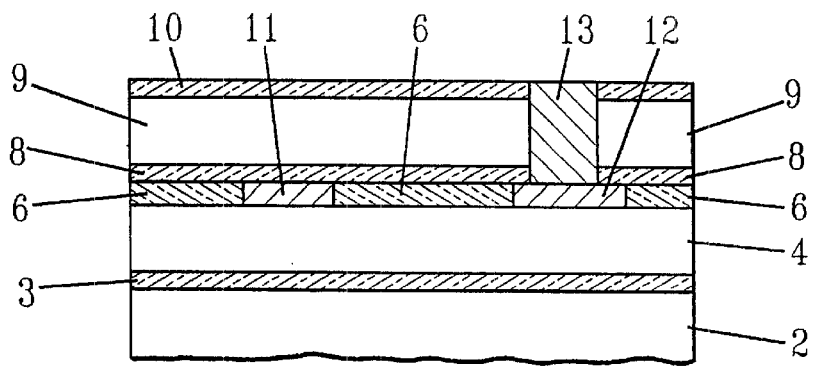

As illustrated in FIG. 5, active devices from the second level structure are connected to the first level interconnection pads. This is achieved by known photolithographic techniques. For example selected portions of the silicon substrate 9 and insulating layers 10 and 8 can be removed down to the first level interconnection pads 12 by employing conventional techniques such as providing a radiation sensitive photoresist material (not shown) and then patterning it to the desired structure. The patterned resist acts as a mask for removing selected portions of the insulating layers and thin silicon layers. These can be removed by reactive ion etching. The photoresist after patterning is then removed such as by dissolving in a suitable solvent. After removal of portions of the insulating layers 8 and 10 and silicon layer 9, a conductive material 13 such as doped polycrystalline silicon or a metallic silicide is deposited in the via and on top of insulating layer 10. The material on top of the insulating layer 10 is removed by chemical mechanical polishing to provide a planar structure as illustrated in FIG. 5.

Figure 6:
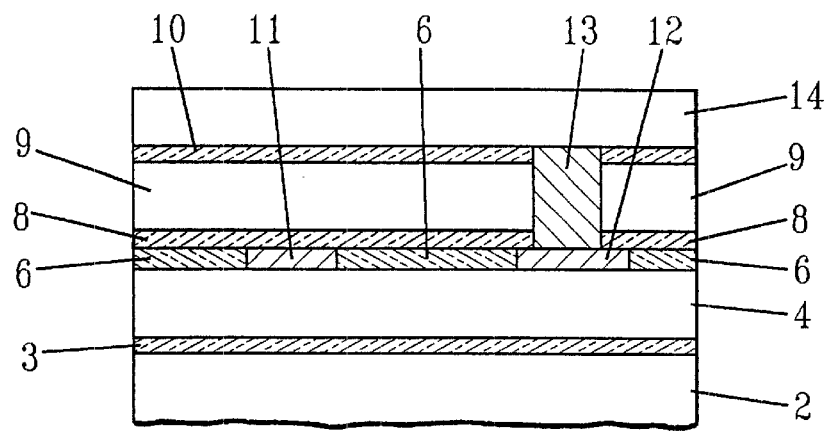

FIG. 6 illustrates providing the back end of the line (BEOL) 14 process to connect devices to complete the chip functionality.

The foregoing description of the invention illustrates and describes the present invention. Additionally, the disclosure shows and describes only the preferred embodiments of the invention but, as mentioned above, it is to be understood that the invention is capable of use in various other combinations, modifications, and environments and is capable of changes or modifications within the scope of the inventive concept as expressed herein, commensurate with the above teachings and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

What is claimed is:

1. A method for fabricating a multistack 3-D semiconductor structure comprising:

providing a first level structure comprising a semiconductor substrate and a first active device;

providing an insulating layer on the first level structure and electrical interconnections to connect selected portions of the first level structure to subsequently to be provided second level structure;

adhering a second semiconductor substrate on top of the insulating layer and thinning the second semiconductor substrate and thereafter forming second active devices in the second semiconductor substrate; and wherein the first active devices are more heat tolerant in device design than the second active devices; and making electrical interconnections between the first level structure and second active devices.

2. The method of claim 1 wherein the first semiconductor substrate is a SOI structure.

3. The method of claim 1 wherein the first semiconductor substrate comprises monocrystalline silicon.

4. The method of claim 1 wherein the first active device comprise at least one member selected from the group consisting of resistor, capacitor, diode and transistor.

5. The method of claim 1 wherein the electrical interconnections comprise doped polycrystalline silicon.

6. The method of claim 1 which comprises reducing the thickness of the second semiconductor substrate by ion implanting into the second semiconductor substrate ions selected from the group consisting of hydrogen, rare gas ions and mixtures thereof, then bonding the second semiconductor substrate to the insulating layer and then subjecting the substrate to thermal treatment at a temperature above that for the ion implanting thereby causing separation of a thin substrate layer bonded to the insulating layer from the remainder of the second semiconductor substrate.

7. The method of claim 1 wherein the thickness of the second semiconductor substrate is about 500 to about 2500 Å.

8. The method of claim 1 wherein the insulating layer comprises silicon dioxide.

9. The method of claim 1 which further comprises providing local electrical interconnection between the first active device and at least one other active device of the first level structure.

10. The method of claim 9 wherein the local electrical interconnection comprises doped polycrystalline silicon.

11. The method of claim 1 which further comprises providing an insulating layer above the second level structure.

12. A multistack 3-D semiconductor structure obtained by the method of claim 1.

* * * * *